(12) United States Patent
Smith

(10) Patent No.: US 6,285,601 B1
(45) Date of Patent: Sep. 4, 2001

(54) METHOD AND APPARATUS FOR MULTI-LEVEL BUFFER THRESHOLDS FOR HIGHER EFFICIENCY DATA TRANSFERS

(75) Inventor: David W. Smith, Cedar Park, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/606,133

(22) Filed: Jun. 28, 2000

(51) Int. Cl.$^7$ .................................................... G11C 7/00

(52) U.S. Cl. ............................. 365/189.05; 365/189.07

(58) Field of Search ........................... 365/189.05, 189.07

(56) References Cited

U.S. PATENT DOCUMENTS 4,707,738 * 11/1987 Ferre et al. ........................... 358/135

* cited by examiner

Primary Examiner—David Nelms
Assistant Examiner—M. Tran
(74) Attorney, Agent, or Firm—Williams, Morgan & Amerson, P.C.

(57) ABSTRACT

A buffer and its associated control mechanism provide multiple threshold levels at which a buffer service request may be initiated. A control mechanism generally includes one or more storage devices for storing at least two buffer threshold values, and a circuit for comparing the level of data in the buffer to each of the threshold values. As the level of data in the buffer becomes equal to or exceeds one of the threshold values, a service request is made. The service requests initiated at the different threshold values may be set at different service priority levels.

40 Claims, 2 Drawing Sheets

METHOD AND APPARATUS FOR MULTI-LEVEL BUFFER THRESHOLDS FOR HIGHER EFFICIENCY DATA TRANSFERS

BACKGROUND OF THE INVENTION

1. Field of the Invention

The present invention relates to buffers that are commonly used in integrated circuit devices to provide a location to place data until the data is retrieved or used by another portion of the integrated circuit device.

2. Description of the Related Art

Integrated circuit devices may be of many different types, including, for example, microprocessors, memory devices, specialized controllers, and communication devices of many different types. Frequently, integrated circuit devices of various types will be combined and interconnected by way of buses. Typically, data (including, for example, addresses, instructions and information) will be passed between the integrated circuit devices connected to the bus. For many well-known reasons, the different integrated circuit devices operate internally at different speeds from one another, and the integrated circuit devices may each be capable of transferring data to and from themselves at differing rates. To make up for these variations in transfer speed between a supplier of data and a consumer of data, a memory device known as a buffer may be used. A buffer provides a location to place data waiting to be consumed. A buffer may also be used to provide a location to collect some minimum amount of data before a consumer begins moving the grouped data to minimize the overhead of carrying the grouped data along a bus or other communication channel, for example.

Buffers are typically filled by a producer and emptied by a consumer. If the producer produces data that cannot be placed in the buffer, because the buffer is full, for example, then the data may be lost and the process damaged. Therefore, the usage model of a buffer is that a controller fills the buffer until the level of data in the buffer is such that the buffer should be emptied. This level is usually arbitrary within a certain range: large enough to be worth transferring the data over a channel that has certain overhead for any given transfer, yet small enough that the data should not overrun the buffer's maximum size. If the buffer transfer request threshold is set too small, then the buffer will be under-utilized. If the buffer transfer request threshold is set too high, the buffer will sometimes overflow, resulting in lost data, among other possible drawbacks. Typically, the buffer transfer request threshold is set as a compromise between a "too low" level and a "too high" level. For example, buffers used in many communications devices are set permanently and then forced to work in that compromised mode at all times. The buffer usage model changes when there are various levels of priority to the servicing of the buffer. Such multi-level priority buses and mechanisms exist, and communications with single buffer threshold levels are not the most efficient way to use a variable priority service mechanism.

To illustrate, consider a bus mechanism utilized to move data from a buffer in a device to memory or some other location closer to the consumer of the data. The bus, in attempting to maximize performance, is organized to carry large amounts of data at one time and to be fair to each of the bus devices or agents, allowing them each to participate on the bus with a transfer of data. If the bus mechanism handles all requests at the same priority level and empties the buffer between other long transfers on the bus, the bus will continue to be efficient. However, the maximum amount of time that may be taken by all other devices on the bus, before the buffer can again be serviced, might be quite long and exceed the ability of the buffer to hold its incoming data. If the buffer is sized large enough to support the maximum amount of time that other agents use the bus (known as latency) before it can be serviced in the worst case, the buffer is then much larger than the average size needed in the average transfer with average latency (between a request and the service). This situation leads to very large buffers that cost more than buffers that would be used in average situations without the latencies of the other bus devices. Such a buffer is shown in FIG. 1.

FIG. 1 illustrates a buffer 10 that is sized to accommodate a level 13 of data that may accumulate before the system empties the buffer 10 under worst-cast conditions. Level 12 represents an empty buffer. Until the buffer 10 is filled to a minimum level 14, not enough data is accumulated to efficiently transfer that data across the bus or other transport mechanism. The level 15 represents an amount of data accumulated after which the buffer 10 will be emptied by the system under the most favorable service conditions. The level 16 represents an amount of data that will accumulate before the buffer 10 is emptied, on average. Thus, the span 17 illustrates the buffer capacity that is "wasted" between the maximum possible capacity requirement and the minimum required capacity, and the span 18 illustrates the buffer capacity that is "wasted" on average, that is, the capacity between the maximum possible capacity requirement and the capacity needed on average.

Alternatively, a bus may have the ability to service a buffer at a higher priority level through various bus priority controls, arbitration controls or ordering mechanisms. In this situation, the buffer may fill until it is required to be emptied, at which time the bus mechanism will stop all of the transactions to complete the buffer transfer and empty the buffer. This higher level priority response has its own costs. Regardless of the mechanism used, the bus mechanism must interrupt or defer another transfer that was previously scheduled to occur or was already in progress, resulting in lowered bus efficiency.

The present invention is directed to a buffer and its associated control mechanism that solves, or at least reduces, some or all of the aforementioned problems.

SUMMARY OF THE INVENTION

A buffer control apparatus according to the present invention generally comprises a storage device that is adapted to store first and second buffer threshold values, and a circuit coupled to the storage device and coupled to receive an indication of a quantity of data in the buffer. The circuit is adapted to provide a first output signal when the quantity of data in the buffer is at least equal to the first buffer threshold value and a second output signal when the quantity of data in the buffer is at least equal to the second buffer threshold value. The storage device may comprise first and second storage devices, such as registers. The circuit may comprise a comparator or first and second comparators.

The method according to the present invention generally includes providing a first signal indicative of a level of data in the buffer, comparing a first threshold value to the first signal, generating a first output signal when the level of data in the buffer is at least equal to the first threshold value, comparing a second threshold value to the first signal, and generating a second output signal when the level of data in the buffer is at least equal to the second threshold value.

BRIEF DESCRIPTION OF THE DRAWINGS

The invention may be understood by reference to the following description taken in conjunction with the accompanying drawings, in which like reference numerals identify like elements, and in which.

Figure 2:
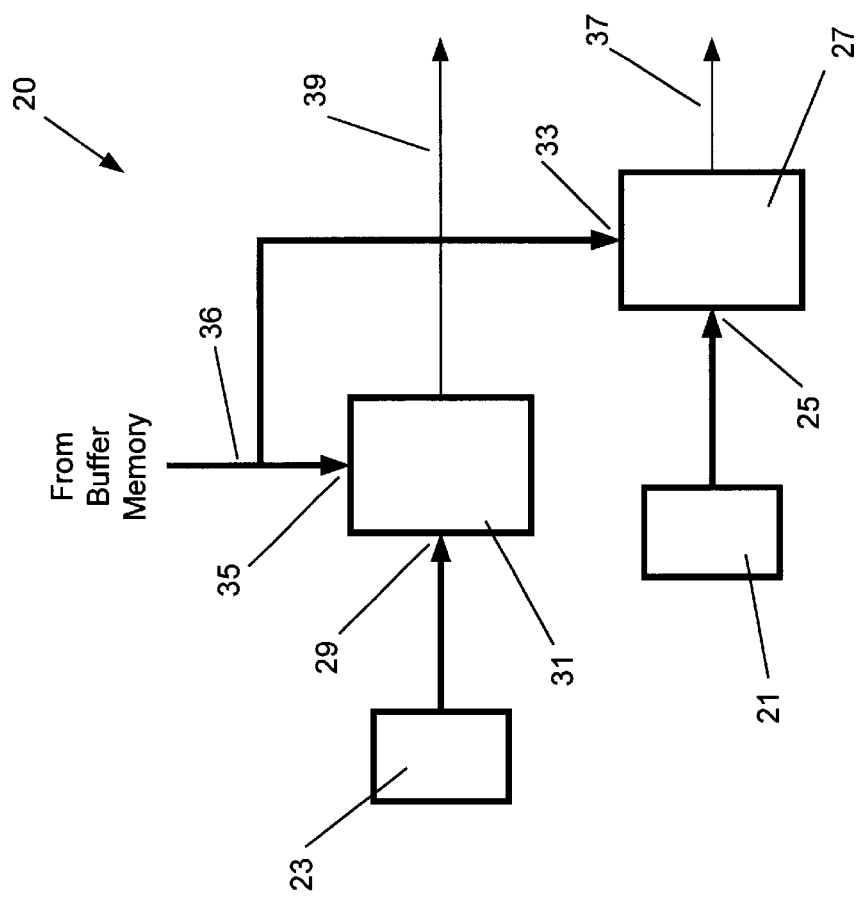
FIG. 2 illustrates one embodiment of the present invention in which a two-level buffer threshold is provided.
Figure 1:
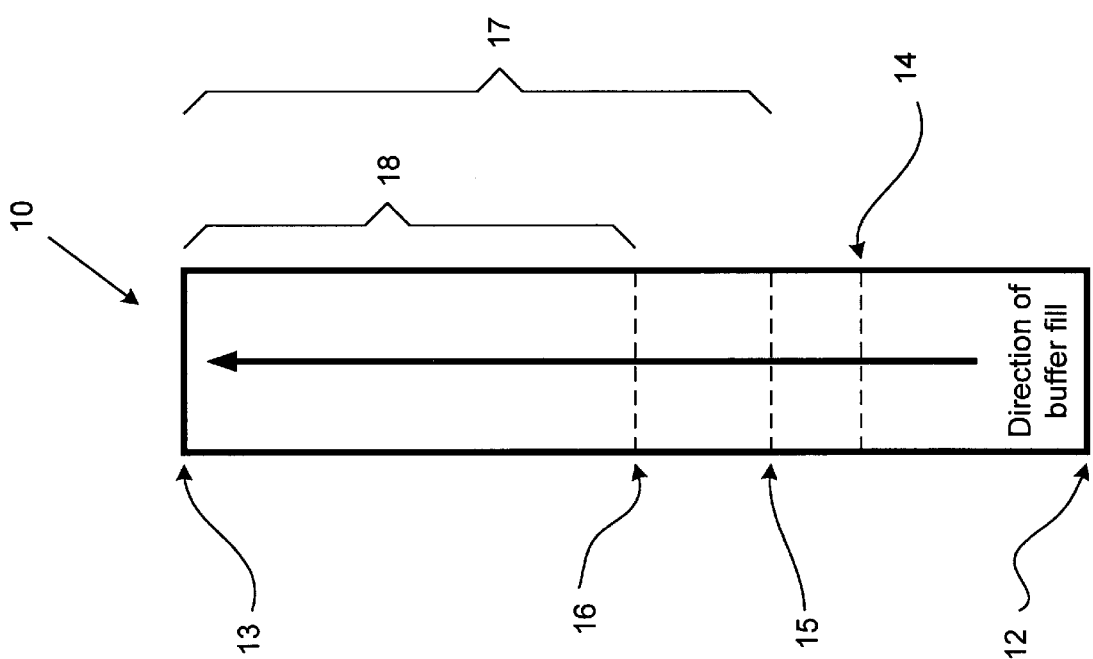
FIG. 1 conceptually illustrates a buffer sized for a maximum possible capacity requirement.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention is directed to a buffer and associated circuitry. As will be readily apparent to those skilled in the art upon a complete reading of the present application, the present invention may be implemented using a variety of technologies, e.g., NMOS, PMOS, CMOS, BiCMOS, etc., and is readily applicable to a variety of devices, including, but not limited to, microprocessors, logic devices, memory devices, etc. Moreover, the present invention may be applied to a device using any kind of semiconductor substrate material, such as silicon, germanium, GaAs, or other semiconductor material.

The present invention comprises an apparatus, operating in conjunction with a buffer, that provides multiple request signals, each with a different priority level and each assigned to a different threshold level. The different threshold levels allow the buffer to be utilized more efficiently. A relatively low priority service would allow other devices on a bus, for example, to transfer their data on the bus sooner, or more often, than the low-priority channel. Conversely, a relatively high priority service would require that other devices wait while the high-priority device is serviced, even if that delay or interruption resulted in a lower overall bus efficiency.

Using the present invention, a bus will be able to initiate multiple levels of service, with lower and higher priority levels of the device, if requested. In fact, three or more levels of priority may be utilized. Using the present invention, a controller may fill a buffer until the level of data in the buffer indicates that the buffer can be serviced, at which time a relatively lower priority request may be issued and the buffer can be serviced when most convenient in view of the current or scheduled bus traffic. In many cases, the buffer will be emptied normally and quickly, with various levels of traffic on the bus and various random delays between a request and a service. However, if the data is not transferred from the buffer soon after the lower priority request is issued, the level of data will continue to rise in the buffer. When the level of data becomes such that the buffer must be emptied, a higher priority request will be issued. The higher priority request level is chosen such that the time required for the consuming process (hardware or software) to empty the buffer from that level in the higher priority mode equals or is less than the amount of time the producer will take to fill the buffer completely from that level. When the higher priority request is made, the buffer will be serviced more quickly relative to other bus requests because of its increased priority level. Using the present invention, the buffer will normally be serviced at a lower priority level and with higher bus efficiency, and the buffer will encounter average, low priority time delays. When the latency between request and service becomes longer, for example, because of heavy bus traffic, the buffer will continue to fill and eventually issue a higher priority request. Two or more request levels may be used and, preferably, the highest level of priority will occur only rarely.

FIG. 2 depicts one illustrative embodiment of the present invention. A first register 21 is programmed with a first buffer threshold level that will trigger a relatively low priority request for buffer service. This register 21 is programmable by a processor or other such device. The first register 21 is coupled to one input terminal 25 of a comparator 27. A second input terminal 33 of the comparator 27 is coupled to receive a signal 36 from the buffer memory, indicating the level to which the buffer has been filled. The comparator 27 compares the input from the first register 21 and the signal 36 from the buffer memory and, when the buffer memory has been filled to at least the first buffer threshold level designated in the first register 21, the comparator 27 generates a request signal 37 to the system to service the buffer at a relatively low priority.

A second register 23 is also programmable by means of a processor or other such device to store a second, higher buffer threshold level than that of the first register 21. A signal indicative of this higher threshold level is applied to a first input terminal 29 of a comparator 31. The signal 36 from the buffer memory is applied to a second input terminal 35 of the comparator 31 to indicate the level to which the buffer has been filled. When the buffer, as indicated by the signal 36 at the input terminal 35, has been filled to a level at least equal to that designated in the second register 23, the comparator 31 generates a request signal 39 to the system to service the buffer at a higher priority than that of request signal 37. In one illustrative embodiment, the buffer threshold level that will be programmed into the first register 21 will generally match the minimum level of data in the buffer that would efficiently utilize the bus, whereas the buffer threshold level programmed into the second register 23 would generally match the level at which the buffer can be emptied at the system's fastest response time.

Figure 3:
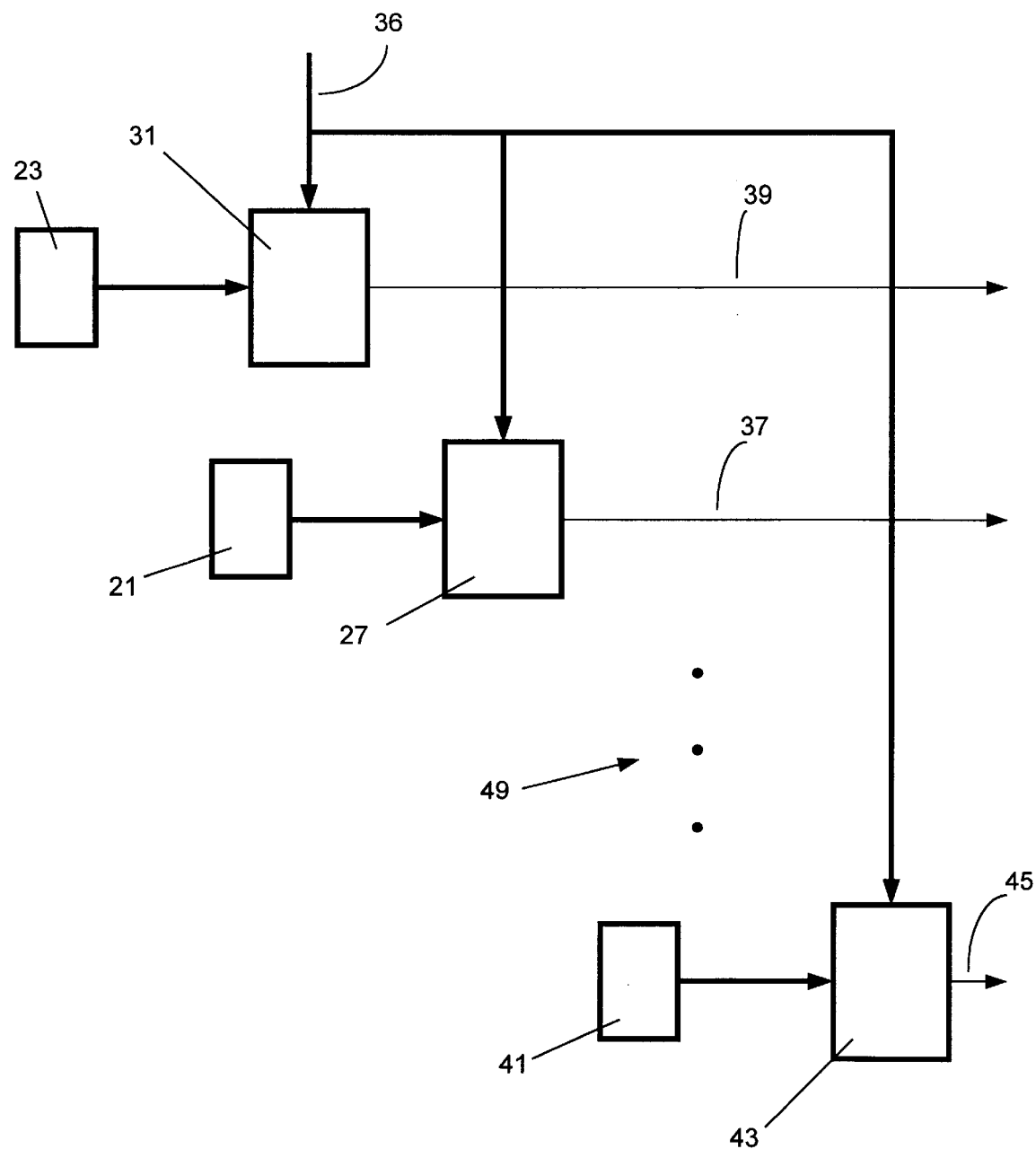
FIG. 3 illustrates an embodiment of the present invention in which at least three levels of buffer threshold are provided.

FIG. 3 illustrates yet another illustrative embodiment of the present invention. The embodiment of FIG. 3 provides three or more levels at which requests will be made to the system to service the buffer, each level generating its request at a higher priority than the previous level. As in the embodiment of FIG. 2, registers 21 and 23 may be programmed with first and second threshold levels at which buffer service requests will be issued at first and second priority levels, respectively. For example, register 21 may be programmed with a buffer threshold level at which a lowest priority service request will be issued. Likewise, register 23 may be programmed with a buffer threshold level at which a service request having a somewhat higher priority will be issued. Comparators 27 and 31 are coupled to receive inputs from the registers 21 and 23, respectively, and are coupled to also receive the signal 36 from the buffer indicating the level of data in the buffer. The comparators 27 and 31 will generate request signals 37 and 39, respectively, with the request signal 37 being at the lowest desired priority and the request signal 39 being at the somewhat higher desired priority.

The embodiment of FIG. 3 also provides a third level at which a buffer service request will be made. A register 41 may be programmed with a buffer threshold level at which a third service request will be issued, and this level may be chosen to be higher than the values programmed into either of the registers 21 and 23. A third comparator 43 is coupled to receive an input from the register 41 as well as the signal 36 from the buffer memory indicating the level of data in the buffer. When the level of data in the buffer reaches the buffer threshold level programmed into the register 41, a third service request signal 45 will be generated, and this third service request will be at a higher priority than the service requests generated by either of the comparators 27 and 31. In this case, the circuitry provides three threshold levels of data in the buffer that will cause the generation of three service requests, each at successively higher priorities. Although not shown in FIG. 3, as indicated by the vertical ellipses 49, more than three levels may be provided by the addition of fourth, fifth, or more, register/comparator sets. Thus, as many threshold levels as desired or appropriate may be provided through implementation of the present invention.

As those of ordinary skill in the art will appreciate with the benefit of the present disclosure, the various threshold levels programmed into the registers may be programmed, in the alternative, into any suitable storage element. For example, suitable storage elements include, but are not limited to, a register, a read only memory (ROM), a random access memory (RAM), etc. Likewise, the two or more comparators used in the specific embodiments described herein may be replaced by a single device having multiple inputs and capable of generating multiple output signals in response to differing combinations of input signals. Thus, multiple threshold signals may be applied to a single device, along with a signal from the buffer memory indicating the level to which it has been filled, and the device will be capable of generating an output signal that indicates the priority with which the buffer should be serviced. The implementation of registers or other storage elements and the implementation of comparators and other appropriate circuitry is well within the ability of those of ordinary skill in the art having the benefit of the present disclosure.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A buffer in an integrated circuit device, comprising:
 a buffer memory for holding data;
 a first storage device;
 a first comparator coupled to the first storage device;
 a second storage device; and
 a second comparator coupled to the second storage device,
 the first storage device being adapted to store a first threshold value and the second storage device being adapted to store a second threshold value,
 the first comparator coupled to receive an input from the first storage device and an input indicative of a level of data in the buffer memory, and provide a first request to service the buffer at a first priority level,
 the second comparator coupled to receive an input from the second storage device and an input indicative of a level of data in the buffer memory, and provide a second request to service the buffer at a second priority level.

2. The buffer of claim 1, wherein the first storage device is programmed to store a first threshold value.

3. The buffer of claim 1, wherein the first and second storage devices are programmed to store first and second threshold values, respectively.

4. The buffer of claim 1, wherein the first storage device comprises a register.

5. The buffer of claim 1, wherein the first and second storage devices comprise registers.

6. The buffer of claim 1, wherein the first and second storage devices comprise a random access memory (RAM).

7. The buffer of claim 1, wherein the first and second storage devices comprise a read only memory (ROM).

8. The buffer of claim 1, wherein the first and second comparators are coupled to the buffer memory to receive an input indicative of a level of data in the buffer memory.

9. A buffer control apparatus, comprising:
 a first storage device adapted to store a first threshold value at which a buffer may be serviced at a first priority level;
 a second storage device adapted to store a second threshold value at which the buffer may be serviced at a second priority level; and
 a circuit adapted to receive an input from each of the first and second storage devices and provide a request for buffer service at the first priority level if the buffer is filled to the first threshold value and a request for buffer service at the second priority level if the buffer is filled to the second threshold value.

10. The buffer control apparatus of claim 9, wherein the first storage device comprises a register.

11. The buffer control apparatus of claim 9, wherein the first and second storage devices comprise registers.

12. The buffer control apparatus of claim 9, wherein the first and second storage devices comprise a random access memory (RAM).

13. The buffer control apparatus of claim 9, wherein the first and second storage devices comprise a read only memory (ROM).

14. The buffer control apparatus of claim 9, wherein the first storage device comprises a programmable storage device.

15. The buffer control apparatus of claim 9, wherein the first and second storage devices comprise programmable storage devices.

16. The buffer control apparatus of claim 9, wherein the circuit comprises a comparator.

17. The buffer control apparatus of claim 9, wherein the circuit comprises at least first and second comparators, and wherein the first comparator is coupled to receive an input from the first storage device and the second comparator is coupled to receive an input from the second storage element.

18. A control apparatus for a buffer in an integrated circuit device, comprising:

a storage device adapted to store first and second threshold values; and a circuit coupled to the storage device and coupled to receive an indication of a quantity of data in the buffer, the circuit adapted to provide a first output signal when the quantity of data in the buffer is at least equal to the first threshold value and a second output signal when the quantity of data in the buffer is at least equal to the second threshold value.

19. The control apparatus of claim 18, wherein the storage device comprises a programmable storage device.

20. The control apparatus of claim 18, wherein the storage device comprises at least two registers.

21. The control apparatus of claim 18, wherein the storage device comprises a random access memory (RAM).

22. The control apparatus of claim 18, wherein the storage device comprises a read only memory (ROM).

23. The control apparatus of claim 18, wherein the circuit comprises a comparator.

24. The control apparatus of claim 18, wherein the circuit comprises first and second comparators, and wherein the first comparator is adapted to provide the first output signal and the second comparator is adapted to provide the second output signal.

25. A control apparatus for a buffer in an integrated circuit device, comprising:

a first register adapted to store a first buffer threshold value;

a second register adapted to store a second buffer threshold value;

a first comparator circuit coupled to receive a first input from the first register and coupled to receive a second input indicative of a level of data in the buffer, and adapted to provide an output signal when the level of data in the buffer is at least equal to the first threshold value; and a second comparator circuit coupled to receive a first input from the second register and coupled to receive a second input indicative of a level of data in the buffer, and adapted to provide an output signal when the level of data in the buffer is at least equal to the second threshold value.

26. A method for generating a buffer service request at multiple buffer thresholds, comprising:

providing a first signal indicative of a level of data in the buffer;

generating a first output signal when the level of data in the buffer is at least equal to a first threshold value; and generating a second output signal when the level of data in the buffer is at least equal to a second threshold value.

27. The method of claim 26, further comprising providing a first threshold value.

28. The method of claim 27, further comprising comparing the first threshold value to the first signal.

29. The method of claim 28, further comprising responding to the first output signal to service the buffer at a first priority level.

30. The method of claim 27, further comprising responding to the first output signal to service the buffer at a first priority level.

31. The method of claim 26, further comprising providing first and second threshold values.

32. The method of claim 31, further comprising:

comparing the first threshold value to the first signal; and comparing the second threshold value to the first signal.

33. The method of claim 32, further comprising:

responding to the first output signal to service the buffer at a first priority level; and responding to the second output signal to service the buffer at a second priority level.

34. The method of claim 31, further comprising:

responding to the first output signal to service the buffer at a first priority level; and responding to the second output signal to service the buffer at a second priority level.

35. The method of claim 26, further comprising comparing a first threshold value to the first signal.

36. The method of claim 35, further comprising responding to the first output signal to service the buffer at a first priority level.

37. The method of claim 26, further comprising:

comparing a first threshold value to the first signal; and comparing a second threshold value to the first signal.

38. The method of claim 37, further comprising:

responding to the first output signal to service the buffer at a first priority level; and responding to the second output signal to service the buffer at a second priority level.

39. The method of claim 26, further comprising responding to the first output signal to service the buffer at a first priority level.

40. The method of claim 26, further comprising:

responding to the first output signal to service the buffer at a first priority level; and responding to the second output signal to service the buffer at a second priority level.

* * * * *